United States Patent
Shinotsuka

(10) Patent No.: US 8,986,567 B2
(45) Date of Patent: Mar. 24, 2015

(54) MAGNETIC BODY COMPOSITION AND A MAGNETIC BODY PRODUCT

(71) Applicant: Michiaki Shinotsuka, Kanagawa (JP)

(72) Inventor: Michiaki Shinotsuka, Kanagawa (JP)

(73) Assignee: Ricoh Company, Ltd., Tokyo (JP)

( * ) Notice: Subject to any disclaimer, the term of this patent is extended or adjusted under 35 U.S.C. 154(b) by 8 days.

(21) Appl. No.: 13/896,865

(22) Filed: May 17, 2013

(65) Prior Publication Data

US 2013/0306903 A1     Nov. 21, 2013

(30) Foreign Application Priority Data

May 21, 2012 (JP) .................. 2012-115660

(51) Int. Cl.
| | |
|---|---|
| H01F 1/26 | (2006.01) |
| H01F 1/28 | (2006.01) |
| H01F 1/01 | (2006.01) |
| H01F 1/00 | (2006.01) |
| H05K 9/00 | (2006.01) |
| H01F 1/37 | (2006.01) |

(52) U.S. Cl.
CPC ............... H01F 1/01 (2013.01); H01F 1/0063 (2013.01); H05K 9/0083 (2013.01); H01F 1/0027 (2013.01); H01F 1/37 (2013.01)
USPC .................. 252/62.54; 252/62.583; 252/62.56

(58) Field of Classification Search
USPC ...... 252/62.51 R, 62.53, 62.54, 62.55, 62.56, 252/62.57, 62.59, 62.62; 428/812, 428/822.1–822.5, 842.1–842.5
See application file for complete search history.

(56) References Cited

U.S. PATENT DOCUMENTS

| | | | |
|---|---|---|---|
| 3,072,575 A * | 1/1963 | Gorter et al. ................ 252/62.59 |
| 4,904,530 A * | 2/1990 | Huizing et al. ................ 428/402 |
| 4,927,728 A * | 5/1990 | Isoda et al. .................. 430/111.1 |
| 6,162,532 A | 12/2000 | Black et al. |
| 6,825,743 B2 | 11/2004 | Rumpf, Jr. et al. |
| 2003/0198885 A1* | 10/2003 | Tamagawa et al. ........... 430/124 |
| 2005/0170216 A1* | 8/2005 | Ejiri ........................ 428/694 ST |
| 2011/0151377 A1* | 6/2011 | Gray et al. .................. 430/270.1 |
| 2012/0064448 A1* | 3/2012 | Sakamoto et al. ......... 430/106.1 |

FOREIGN PATENT DOCUMENTS

| | | |
|---|---|---|
| JP | 2000-048340 | 2/2000 |
| JP | 2000-273288 | 10/2000 |
| JP | 2004-048736 | 2/2004 |
| JP | 3763353 | 4/2006 |
| JP | 4758936 | 8/2011 |

OTHER PUBLICATIONS

Cao et al., "Large-Scale Sythesis and Microwave Absorption Enhancement fo Actinomorphic Tubular ZnO/CoFe2O4 Nanocomposites", 2009, J. Phys. Chem. B, vol. 113, pp. 4642-4647.*

* cited by examiner

Primary Examiner — Carol M Koslow
Assistant Examiner — Lynne Edmondson
(74) Attorney, Agent, or Firm — Cooper & Dunham LLP

(57) ABSTRACT

Disclosed is a magnetic body composition, including a resin and a magnetic nanoparticle, the magnetic nanoparticle including an oxide of at least one kind of metal selected from the group composed of Ga, Zn, and Sn and an FeCo oxide.

8 Claims, 1 Drawing Sheet

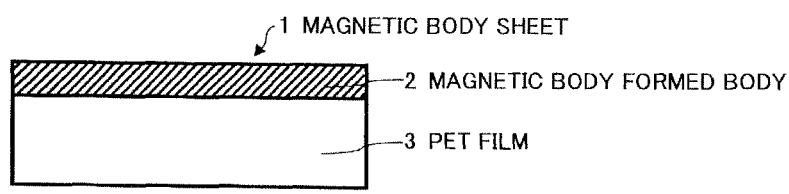

MAGNETIC BODY COMPOSITION AND A MAGNETIC BODY PRODUCT

BACKGROUND OF THE INVENTION

1. Field of the Invention

An aspect of the present invention relates to at least one of a magnetic body composition and a magnetic body product.

2. Description of the Related Art

Many information associated instruments or systems function along with development of information techniques and many of such instruments or systems are operated by digital signals, so that a problem may be that a variety of interference between instruments or devices generated by electromagnetic wave noise causes malfunction thereof. In order to address such a problem, while it may be necessary to suppress undesired electromagnetic wave radiation as may influence on an operation of an individual instrument or device per se or an operation of another instrument or device, it may be necessary to have durability so as not to break down against electromagnetic wave noise (an approaching electromagnetic wave) from an exterior. Thus, it is known that an electromagnetic wave absorbing body that contains a magnetic material, electromagnetic wave absorbing sheet, or the like is used as a countermeasure against electromagnetic wave noise.

In recent years, a nanometer size magnetic material that is expected to develop a specific magnetic characteristic (for example, superparamagnetism, magnetoresistance effect, magnetic anisotropy, or the like) is drawing attention and is being studied. For a nanometer size magnetic material, for example, a method has been proposed for manufacturing a metal magnetic powder for magnetic recording with a particle length greater than or equal to 10 nm and less than or equal to 45 nm and an axis ratio greater than or equal to 2) by applying a reducing agent to a metal magnetic powder that has a metal magnetic phase based on Fe or Fe and Co and contains a non-magnetic component (one or more kinds of Al and Si) in a fluid that contains a complexing agent capable of forming a complex with at least one or more kinds of non-magnetic components (see Japanese Patent Application Publication No. 2008-270300 (Japanese Patent No. 4758936)).

Furthermore, a method has been proposed for forming ferromagnetic nanoparticles by a step of forming a metal precursor solution from a transition metal, a step of adding the metal precursor solution into a surfactant solution, a step of precipitating nanoparticles from the solution by addition of a coagulant without causing permanent coagulation thereof, and a step of conducting recombination or colloid reproduction of the nanoparticles by addition of a hydrocarbon solvent (see U.S. Pat. No. 6,162,532).

Furthermore, a method has been proposed for stabilizing a layered periodic array that is composed of magnetic nanoparticles in a magnetic storage medium wherein the array is formed on a substrate surface (see Japanese Patent Application Publication No. 2000-48340). The magnetic nanoparticles are formed of a magnetic material selected from a group composed of Co, Fe, Ni, Mn, Sm, Nd, Pr, Pt, and Gd elements, intermetallic compounds of the elements, binary alloys of the elements, ternary alloys of the elements, Fe oxides that further include at least one of the elements other than Fe, barium ferrite, and strontium ferrite.

Furthermore, in order to address a need of thinning of a magnetic recording layer as is necessitated to improve a higher output characteristic of a magnetic recording medium, it has been proposed that a non-magnetic underlayer that contains hematite powder is provided on a base film to smooth a surface thereof (see Japanese Patent Application Publication No. 2002-255560 (Japanese Patent No. 3763353)). The hematite powder is an aggregate that has a structure in such a manner that needle hematite particles with an average long axis diameter of 0.005-0.3 μm and an average short axis diameter of 0.0005-0.10 μm are directionally arrayed in a long axis direction.

A feature that determines a magnetic property of nanoparticles is present in a shape thereof. For example, one of conditions involved in magnetically anisotropic energy is isotropy or anisotropy that is greater for an elongated particle than for a spherical particle. Hence, it may be desirable to develop a method for producing particles that have different shapes, or in particular, elongated shapes. That is, one of essential conditions for producing a magnetic particle optimized for such a purpose is present in controlling of a size, size distribution, and shape thereof, and a problem may be that if it is not possible to control a distribution condition, a magnetic body formed by coating or the like may be basically non-uniform and it may not be possible to provide a functionality well.

On the other hand, for a conventional nanometer size magnetic material with an anisotropic shape that has a long axis and a short axis, a problem may be that a magnetic permeability thereof may be lower at a higher frequency. For example, for a needle hematite particle (that has a long axis greater than or equal to 100 nm and a short axis around 20 nm) as described in Japanese Patent Application Publication No. 2002-255560 (Japanese Patent No. 3763353), the magnetic permeability thereof at a higher frequency greater than or equal to 1 GHz is a lower value less than or equal to 1 H/m. Accordingly, it may be difficult to be used as an electromagnetic wave absorbing material for an electronic instrument or device used in a higher frequency domain greater than or equal to 1 GHz (for example, an RF instrument or a UHF instrument).

Additionally, a semiconductor component, a circuit board, and the like are known as the electronic instrument or device. For example, for a circuit board, an RF circuit has been proposed wherein a circuit for processing a radio frequency signal is formed on a dielectric substrate that has a meta-substance area (meta-substance: a substance formed by compounding two or more substances mixed or arranged at an extremely fine level such as a molecule or nanometer) that has a locally selective magnetic permeability and a substrate characteristic (see Japanese Patent Application Publication No. 2007-048736).

Furthermore, for a material for sealing a semiconductor component, a sealing resin composition has been proposed where 0.3-1.0 weight % of a carbon black with an average particle diameter of 20-40 nm per 100 weight % of the sealing resin composition is contained in a resin based on an epoxy resin base compound, a curing agent, and an accelerating agent (see Japanese Patent Application Publication No. 2000-273288). Thereby, it may be possible to obtain a sealing resin composition that has both an insulating property and a light blocking property.

As described above, problems may be that a ratio of a long axis to a short axis of a magnetic body may be greater than or equal to 2 in a conventional nanometer size magnetic material with an anisotropic shape that has a long axis and a short axis (Japanese Patent Application Publication No. 2008-270300 (Japanese Patent No. 4758936)) and a magnetic permeability at a higher frequency may be lower in Japanese Patent Application Publication No. 2002-255560 (Japanese Patent No. 3763353) (wherein a long axis is greater than or equal to 100 nm and a short axis is around 20 nm). For example, a needle hematite particle described in Japanese Patent Application Publication No. 2002-255560 (Japanese Patent No. 3763353) has a magnetic permeability at a higher frequency greater than or equal to 1 GHz that is a lower value less than or equal to 1 H/m. Additionally, although the magnetic permeability is expressed as a real term and ideal term separately, the magnetic permeability presented in an embodiment of the present invention refers to a real part of a complex magnetic permeability and a unit thereof is H/m.

Because the magnetic permeability of nanometer size magnetic material with an anisotropic shape at a higher frequency may be lower, it may be difficult to be used as a magnetic wave absorbing material for an electronic instrument or device used in a higher frequency domain greater than or equal to 1 GHz (for example, a digital camera, a mobile phone, a microprocessor or LSI for a notebook personal computer, or a UHF instrument or RF instrument such as a liquid crystal panel). Furthermore, although a variety of magnetic materials that contain nanometer size magnetic materials (nanoparticles) and have electromagnetic wave absorbing capabilities are being studied, a problem may be that it may be difficult to control sizes, a size distribution, and shapes of nanoparticles, and when, for example, forming due to coating or the like is conducted by using a forming material that includes such nanoparticles, a magnetic body may be non-uniform so that it may not be possible to exert functionality thereof sufficiently.

SUMMARY OF THE INVENTION

According to one aspect of the present invention, there is provided a magnetic body composition, including a resin and a magnetic nanoparticle, the magnetic nanoparticle including an oxide of at least one kind of metal selected from the group composed of Ga, Zn, and Sn and an FeCo oxide.

According to another aspect of the present invention, there is provided a magnetic body product produced by using the magnetic body composition as described above.

BRIEF DESCRIPTION OF THE DRAWINGS

FIGURE is a diagram that illustrates a general structure of each of magnetic body sheets fabricated in practical examples.

DETAILED DESCRIPTION OF THE PREFERRED EMBODIMENTS

As described above, a magnetic body composition according to an embodiment of the present invention is a magnetic body composition that contains a resin and a magnetic body composed of a nanoparticle, characterized in that the magnetic body is a nanoparticle that includes as an oxide of at least one kind of metal selected from Ga, Zn, and Sn elements and an FeCo oxide as essential components.

A magnetic body in a magnetic body composition (and a magnetic body formed body formed by using a magnetic body composition) according to an embodiment of the present invention is a nanoparticle that includes an oxide of at least one kind of metal selected from Ga, Zn, and Sn elements and an FeCo oxide as essential components. Herein, a composition ratio of "an oxide of at least one kind of metal selected from Ga, Zn, and Sn elements" and "an FeCO oxide" that constitute a magnetic body is, preferably, in a range of $Fe_{70}Co_{30}$—$Fe_{30}Co_{70}$ [an amount of Co is 30-70 at %, wherein, however, 50 at % is excluded (when an amount of Co is 50 at %, regular and irregular structures may be provided)] (99.5-92% by mass) with respect to Ga (0.5-8% by mass), Zn (0.5-8% by mass), and Sn (0.5-8% by mass). More preferably, such a range is $Fe_{60}Co_{40}$—$Fe_{40}Co_{60}$ [an amount of Co is 40-60 at %, wherein, however, 50 at % is excluded (when an amount of Co is 50 at %, regular and irregular structures may be provided)] (99-95% by mass) with respect to Ga (1-5% by mass), Zn (1-5% by mass), and Sn (1-5% by mass).

As the above-mentioned range is provided, it may be possible to obtain a magnetic body composed of a spherical nanoparticle, and further, it may be possible to form one with a greater magnetic permeability at a higher frequency domain greater than or equal to 1 GHz.

On the other hand, if amounts of Ga, Zn, and Sn elements are less than the above-mentioned range, brittleness may be provided for a hardness of a magnetic particle. Furthermore, if such amounts are greater than the above-mentioned range, brittleness may also be provided, and it may be possible to obtain a hard and strong magnetic particle in the above-mentioned range.

Additionally, such a magnetic permeability may not be limited and an objective value thereof is greater than or equal to 2 H/m at a higher frequency greater than or equal to 1 GHz.

A magnetic body composed of a nanoparticle as described above is not limited and it may be possible to be manufactured by using raw materials as described below, mixing them, and subsequently apply heat treatment thereto. Compounding of raw materials is adjusted so as to provide a range of composition ratio as described above.

For an Fe material, it may be possible to provide iron(II, III) acetylacetonate [$C_{10}H_{14}FeO_4$, $Fe(CH_3COCHCH_3)_3$], iron (II) acetate [$C_4H_6O_4Fe$], hexaammine complex salt (Fe $(NH_3)_6$ $Cl_2$), iron(II) lactate trihydrate ($Fe(CH_3CH(OH)COO)_2$), iron(II) oxalate dihydrate [$FeC_2O_4.2H_2O$], or the like.

For a Co material, cobalt oleate $Co(C_{17}H_{33}COO)_2$, hexaamminecobalt(II) complex salt ($Co(NH_3)_6Cl_2$), cobalt (II) acetylacetnate ($CH_3COOH:C(CH_3)O)_2Co$), or cobalt (III) acetylacetnate [$Co(CH_3COCHCOCH_3)$] may be desirable.

For a raw material for each of Ga, Sn, and Zn, an alkoxide compound, an oxide, or the like is used, and it may also be possible to use a commercially available nanoparticle. For example, it may be possible to use a triethoxygallium [Ga $(C_2H_5O)_3$] nanoparticle (number average value: 80-100 nm) as a raw material for Ga, a $SnO_2$ (tin oxide) nanoparticle (number average value: 20-40 nm) as a raw material for Sn, and an oxide [ZnO] nanoparticle (number average value: 20-40 nm) as a raw material for Zn.

A method for mixing powder of raw materials as described above may be a dry mixing in atmospheric air due to a ball mill or the like, and when a homogeneous mixing is conducted, a wet mixing by using a solvent such as isopropyl alcohol on a ball mill may be desirable. Heat treatment is applied to obtained mixed powder in nitrogen atmosphere at a temperature in a range of 500-1100° C. in a heating furnace in which a concentration of oxygen in atmosphere is controllable to be less than or equal to 100 ppm. If the temperature is less than 500° C., reaction may be insufficient so that decomposition or reduction of a metal complex or the like may readily be incomplete.

A metal complex as described above or the like may be decomposed in a process of heat treatment so that gas that contains H, C, N, O, or the like may be dispersed and a remaining metal component may form a magnetic metal particle to form FeCO that includes Ga, Sn, or Zn.

Although it may also be possible to obtain a magnetic body composed of a nanoparticle(s) as described above by synthesis, a commercially available product may be used. Such a magnetic body is not limited, and for example, it may be possible to provide an iron cobalt nanoparticle(s) (produced by Wako Pure Chemical Industries, Ltd.) or the like.

For a number average particle diameter of a magnetic body as described above, it may be preferable to have a spherical particle that is greater than or equal to 30 nm and less than or equal to 90 nm.

If a number average particle diameter is less than 30 nm, oxidation may be caused readily in particular, and on the other hand, if it is greater than 90 nm, fluidity of a composition may be lowered significantly so that a difficulty in producing ink or facilitation of a characteristic variation may be caused and be inappropriate for practical use.

Herein, a number average particle diameter of a magnetic body in an embodiment of the present invention is measured by a scanning electron microscope (SEM) method.

Furthermore, it may be preferable for a (particle) content of a magnetic body as described above to be greater than or equal to 20% by mass and less than or equal to 50% by mass in a total composition. If a (particle) content of a magnetic body is less than 20% by mass, it may be impossible for a magnetic permeability to have effect sufficiently, and furthermore, an effect of improvement of a characteristic of a composition such as a fire retardant property, a cracking-resistant property, a heat conductivity, an elastic modulus or the like may tend to be reduced additionally. On the other hand, if it is greater than 50% by mass, fluidity of a composition may be lowered to cause a difficulty in a forming property. In particular, if an (particle) amount of a compounded magnetic body is greater than 80% by mass, fluidity of a composition may be lowered significantly to be inferior in a forming property and accordingly inappropriate for practical use.

A resin that constitutes a magnetic body composition according to an embodiment of the preset invention may be a thermosetting resin such as an epoxy resin, a urethane resin, or a silicone resin or a thermoplastic resin such as an acrylic resin, a polyester, or a polyimide and it may be possible to be selected from various kinds of publicly-known resins depending on an object or application.

A resin system that is a combination of an epoxy resin and a phenol resin curing agent that may be able to be used preferably in an embodiment of the present invention (abbreviation: "epoxy resin-phenol resin curing agent system") will be described and provided as an example below.

It may be sufficient for an epoxy resin that may be an essential component of an epoxy resin-phenol resin curing agent system to be an epoxy compound that has two or more epoxy groups in a molecule thereof, and a kind thereof or the like is not limited. For such an epoxy resin, it may be possible to provide an epoxy resin that may be able to be obtained by epoxidation of a condensate of a phenol or an alkylphenol and hydroxylbenzaldehyde, a phenol-novolac-type epoxy resin, a cresol-novolac-type epoxy resin, a naphthol-novolac-type epoxy resin, a bisphenol A-novolac-type epoxy resin, a bisphenol glycidyl ether, an epoxy compound of a tetra(hydroxylphenyl)alkane, a bishydroxybiphenyl-type epoxy resin, or the like, and one kind or a mixture of two or more kinds thereof may be used.

Additionally, when a magnetic body composition is used in, for example, a semiconductor element or the like, it may be preferable for a content of chlorine included in an epoxy resin to be less than or equal to 1000 ppm in order to ensure reliability of such a semiconductor element.

On the other hand, it may be sufficient for a phenol resin curing agent that may be an essential component of an epoxy resin-phenol resin curing agent system to have a phenolic hydroxyl group in a molecule thereof and to be able to be cured by reacting with an epoxy group of an epoxy resin, and a kind thereof or the like is not limited.

For such a phenol resin curing agent, it may be possible to provide a phenol-novolac resin, a cresol-novolac resin, a bisphenol-novolac-type phenol resin, a phenol-aralkyl resin, a dicyclopentadiene-modified phenol resin, a paraxylene-modified phenol resin, a multifunctional aromatic phenol resin, a condensate of a phenol and banzaldehyde or naphthylaldehyde, a triphenoimethane compound, a terpene phenol resin, or the like. One kind or a mixture of two or more kinds thereof may be used.

For a phenol resin curing agent as described above, it may be preferable for a hydroxyl group equivalent amount to be greater than or equal to 130, and thereby, it may be possible to provide a cured resin with a fire retardant property, a lower hygroscopic property, or the like. Furthermore, it may be preferable for a concentration of a free phenol included in a resin to be less than or equal to 1% by mass for the purpose of improving reliability.

For a phenol resin curing agent, a synthesized one may be used or a commercially available product may also be used. For a specific example of such a commercially available product, it may be possible to provide MEH-7851 series (bisphenol-novolac-type phenol resins) produced by MEIWA PLASTIC INDUSTRIES, LTD., XL or XLC series (phenol aralkyl resins) produced by Mitsui Chemicals, Inc., FPI series (multifunctional aromatic phenol resins) produced by KASHIMA, or the like.

A compounding ratio of an epoxy resin and a phenol resin curing agent in an epoxy resin-phenol resin curing agent system is not particularly limited and it may be preferable for a ratio of the number of a phenolic hydroxyl group(s) of a phenol resin to the number of an epoxy group(s) of an epoxy resin (phenolic hydroxyl group number/epoxy group number) to be set in a range of 0.5-1.5 in order to provide a less amount of each unreacted component.

If a ratio of phenolic hydroxyl group number/epoxy group number is less than 0.5, it may be impossible to cause a curing reaction of an epoxy resin sufficiently. On the other hand, if a ratio of phenolic hydroxyl group number/epoxy group number is greater than 1.5, a characteristic of a cured product, in particular, a moisture resistance, may readily be deteriorated.

It may be possible to compound another additive other than essential components as described above into a magnetic body composition according to an embodiment of the present invention according to need in a range in which an effect of such an embodiment of the present invention is not inhibited.

For such another additive, it may be possible to provide an accelerating agent, a surface treating agent such as a silane coupling agent, a releasing agent such as a natural wax or synthetic wax, a stress reducing agent such as a silicone rubber, or the like, that are generally compounded into a resin composition of epoxy resin-phenol resin curing agent system, and limitation to them is not provided.

An accelerating agent as described above is usually compounded into an epoxy resin composition in order to provide a speedily curing property, and it may be possible to be used without a particular limitation as long as it may be possible to cure an epoxy resin.

For such an accelerating agent, it may be possible to provide, for example, an organic phosphine compound such as trimethylphosphine, triethylphosphine, tributylphosphine, triphenylphosphine, tri(p-methylphenyl)phosphine, tri(nonylphenyl)phosphine, methyldiphenylphosphine, dibutylphenylphosphine, tricyclohexylphosphine, 1,2-bis(diphenylphosphino)ethane, or bis(diphenylphosphino)methane, an imidazole compound or a derivative thereof, such as 2-methylimidazole, 2,4-dimethylimidazole, 2-ethyl-4-methylimidazole, 2-phenylimidazole, 2-phenyl-4-methylimidazole, or 2-heptadecylimidazole, DBU (1,8-diazabicyclo(5,4,0)undecene-7) or a phenol salt thereof, or the like. One kind or a mixture of two or more kinds thereof is used according to need.

For a rate of an accelerating agent as described above to be compounded, it may not be possible to determine a preferable amount simply due to each different catalytic activity, but generally, it may be preferable to be added in a range of 0.1% by mass to 5% by mass relative to a total amount of a resin composition.

If an amount of a compounded accelerating agent is less than 0.1% by mass relative to a total amount of a resin composition, it may frequently be impossible to obtain an accelerating function sufficiently. On the other hand, if an amount of a compounded accelerating agent is greater than 5% by mass relative to a total amount of a resin composition, reliability of a moisture resistance of a cured epoxy resin or the like may be lowered.

For a general method for manufacturing a magnetic body composition, it may be possible to provide a method of uniformly mixing (dry-blending) by a mixer or the like, further melting and kneading by a heated roll, a kneader, an extruder, or the like, cooling, and subsequently milling a resin as an essential component (for example, an epoxy resin and a phenol resin curing agent), a magnetic body (a nanoparticle(s) that include(s) an oxide of at least one kind of metal selected from Ga, Zn, and Sn elements as essential components and an FeCo oxide), and another additive component according to need. After milling, it may also be possible to control a grain size by a sieve according to need and be used.

For thus obtained magnetic body composition, it may also be possible to form a magnetic body formed body by using powder directly and a melting method (for example, charging into a die or the like and forming a composition melted by heating), or it may also be possible to form a magnetic body formed body by a coating method using a solution in which a composition is dissolved or dispersed in a solvent (for example, coating and forming on a substrate). A forming method is appropriately selected depending on whether a magnetic body formed body is a sheet body or a bulk body.

As described above, a preferable (nanoparticle) content of a magnetic body may be greater than or equal to 20% by mass and less than or equal to 50% by mass in a total composition. Furthermore, for compounding an epoxy resin and a phenol resin curing agent, [phenolic hydroxyl group number]/[epoxy group number] may be selected to be in a range of 0.5-1.5.

An example of a magnetic body formed body that is a bulk body is not limited and it may be possible to provide a sealing material for an electronic component such as a semiconductor element. Furthermore, an example of a magnetic body formed body that is a sheet body is not limited and it may be possible to provide a magnetic body sheet material with a flexibility (flexible property) that is provided by applying and subsequently curing a solution in which a composition is dissolved or dispersed in a solvent on a resin film (for example, a PET film). Thus, it may be possible to form a magnetic body formed body composed of a sheet body or bulk body by using a magnetic body composition according to an embodiment of the present invention so that it may be possible to be applied to each kind of field for defense against electromagnetic wave noise. For a magnetic permeability of a magnetic body formed body according to an embodiment of the present invention, it may be possible to obtain 2 H/m at 1 GHz, and hence, it may be possible for the magnetic body to be used for defense against electromagnetic wave noise preferably.

In particular, in electromagnetic wave environment involved with development of an instrument that is operated by a digital signal (for example, a radio frequency (RF) instrument, an ultra-high frequency (UHF) instrument: a digital camera or a mobile phone, a microprocessor, LSI or liquid crystal panel of a notebook personal computer, or the like), there may be a concern that various interference problems may occur between instruments or devices due to electromagnetic wave noise to cause malfunction thereof, and hence, it may be necessary to suppress radiation of an undesired electromagnetic wave of an individual device that may influence another device and have durability so as not to break down against an approaching electromagnetic wave from an exterior (electromagnetic compatibility (EMC)). Accordingly, an electromagnetic wave absorber or electromagnetic shield material is used as a technique for preventing such electromagnetic wave interference, and a magnetic body formed body formed by using a magnetic body composition according to an embodiment of the present invention may be useful as an electromagnetic wave absorber.

Furthermore, it may be preferable to include a silicone oil that has an amino group, as represented by general formula (1) as described below, other than an epoxy resin and a phenol resin curing agent as described above.

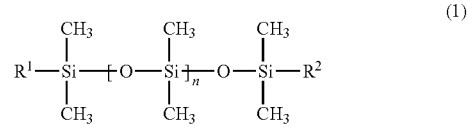
(1)

(In the formula, $R^1$ and $R^2$ are identical or different monovalent organic groups that have an amino group and n is an arbitrary positive integer.)

In general formula (1) as described above, $R^1$ and $R^2$ are organic groups that have an amino group that has reactivity with an epoxy resin, wherein it may be preferable for an amine equivalent of a silicone oil that has an amino group (abbreviation: reactive silicone oil) to be in a range of 3000-8000.

If an amine equivalent of a reactive silicone oil is less than 3000, a poor appearance, characteristic deterioration, or the like, of a magnetic body formed body may readily occur due to bleeding of such a silicone oil in formation using a magnetic body composition. On the other hand, if an amine equivalent of a reactive silicone oil is greater than 8000, it may be impossible to obtain an effect of reduction of static electricity or an effect of suppression of leakage between interconnection lines or the like sufficiently.

It may be possible to reduce static electricity generated at time of resin formation or the like by addition of a reactive silicone oil as described above. Furthermore, a kneading property of a magnetic body composition may be improved by reducing static electricity and it may be possible to form a magnetic body formed body with uniform dispersion of a magnetic body (for example, a magnetic body sheet material). Thus, because a kneading property may be improved by including a reactive silicone oil in a magnetic body composition and reaction and integration with an epoxy resin-phenol resin curing agent system may improve reliability against a higher temperature or a higher humidity, it may be possible for the magnetic body composition to be used as each kind of sheet body or bulk body that has an electromagnetic wave absorbing function (for example, sealing of a semiconductor device or the like).

It may be preferable for an amount of a compounded reactive silicone oil to be in a range of 0.01-3% by mass relative to a total amount of a magnetic body composition. If an amount of compounded reactive silicone oil is less than 0.01% by mass, it may be impossible to obtain an effect of reduction of static electricity or an effect of suppression of leakage between interconnection lines or the like sufficiently. On the other hand, if an amount of a compounded reactive silicone oil is greater than 3% by mass, poor appearance, characteristic degradation or the like due to bleeding of such an oil or the like may readily occur. For an amount of a compounded reactive silicone oil, a range of 0.1-2% by mass may be more preferable and a range of 0.2-1% by mass may be further preferable.

Furthermore, another component may be contained in a magnetic body composition according to an embodiment of the present invention according to need, as long as a performance required for such a composition is not lost. For example, it may be possible to contain a carbon nanotube, a fullerene, a carbon, or the like for improvement of a mechanical characteristic or strength, improvement of durability, suppression of generation of static electricity, or the like.

For a carbon nanotube or a fullerene, it may be possible to use, for example, C60, C70, C82, C84, a further higher molecular weight of fullerene, or the like.

For a method for synthesizing a fullerene or a carbon nanotube, there may be provided a resistive heating method for directly electrically conducting through and heating a graphite rod in a rare gas, an arc discharge method for causing arc discharge between two rods in a rare gas for synthesis, or the like. It may also be possible to use a fullerene or carbon nanotube that includes a metal such as La, Y, or Sc, or the like in internal space. For synthesis of a metal including fullerene, there may be provided a method for causing arc discharge by using a carbon rod that includes a metal oxide ($La_2O_3$ or the like) for synthesis or causing arc discharge by throwing a carbon chip that includes a metal oxide into a crucible-like anode for synthesis.

For an average particle diameter of a fullerene as described above, 0.01-0.2 µm is preferable and 0.01-0.1 µm is more preferable. If an average particle diameter of a fullerene is less than 0.01 µm, aggregation or the like may readily be caused inappropriately, and if it is greater than 0.2 µm, a dispersion state may be deteriorated inappropriately.

Furthermore, a shape of a carbon nanotube may be such that a diameter of 0.01-0.1 µm and a length of 0.05-0.5 µm are preferable and a diameter of 0.01-0.05 µm and a length of 0.05-0.1 µm are more preferable. If a diameter and length of a carbon nanotube are less than 0.01 µm and 0.05 µm, respectively, aggregation may readily be caused inappropriately, and if a diameter and length of a carbon nanotube are greater than 0.1 µm and 0.5 µm, respectively, a uniformity of dispersion may be deteriorated inappropriately.

For a carbon, there may be provided a carbon black or the like. For a particle diameter, an average particle diameter of 0.01-0.2 µm may be preferable. If it is smaller than that, there may be a problem of dust, and if it is greater than such a range, a dispersion may be deteriorated and a uniform film formation may be difficult.

It may be preferable for a content of a fullerene, carbon nanotube, or carbon relative to a resin to be 0.01% by mass-10% by mass relative to 100% by mass of a resin. If a content of a fullerene, carbon nanotube or carbon is less than 0.01% by mass, improvement of durability may not be found, and if a content of a fullerene, carbon nanotube or carbon is greater than 10% by mass, a resin-coated layer may be fragile to deteriorate durability.

A value of a powder resistance of a resin-coated carbon black may be preferably greater or equal to 10 Ω·mm and may be more preferably greater than or equal to $1.1 \times 10^5$ Ω·mm.

Additionally, if a fullerene, carbon nanotube, or carbon is contained, an effect of suppression of generation of static electricity that is an effective function may be provided.

An embodiment of the present invention will further be described specifically below by providing a practical example and a comparative example, and an embodiment of the present invention is not limited to such a practical example.

Practical Example 1

24.0% by mass of multifunctional epoxy resin EPPN-502 (commercial name, produced by NIPPON KAYAKU Co., Ltd.), 7.2% by mass of brominated epoxy resin AER-8028 (commercial name, produced by Asahi Kasei Corporation), 8.8% by mass of multifunctional phenol resin MEH-7500 (commercial name, produced by MEIWA PLASTIC INDUSTRIES, LTD.), 0.5% by mass of 2-methylimidazole as an accelerating agent, 0.2% by mass of an ester-type wax (carnauba No. 1), 0.3% by mass of an epoxy silane coupling agent, 40.0% by mass of spherical nanoparticles (number average particle diameter: 65 nm) as a magnetic body that included a Ga oxide and an FeCo oxide as essential components, 0.2% by mass of a resin-coated carbon black (resin quantity: 10% by mass, particle diameter: about 1 µm, value of powder resistance: $1.0 \times 10^2$ Ω·nm), and 18.8% by mass of a solvent (ethylcellosolve) were mixed at an ordinary temperature, subsequently heated and kneaded at a resin temperature of 80° C., and cooled to obtain a magnetic body composition.

Additionally, a composition ratio of the Ga oxide in the magnetic body is 1.0% by mass in 40.0% by mass of the magnetic body.

Furthermore, the resin-coated carbon black was such that a carbon black (ash content: less than or equal to 1.0% by mass, a specific surface area: 170 m²/g) was coated with an epoxy resin epikote 630 (commercial name, produced by Japan Epoxy Resin CO., Ltd.).

The obtained magnetic body composition was dissolved or dispersed in a solvent (ethylcellosolve) to prepare a coating fluid. The prepared coating fluid was applied onto a PET film with a thickness of 100 µm (Lumirror: registered trademark, produced by TORAY INDUSTRIES INC.) by screen printing (printing machine: a manual screen printing machine produced by Neotechno Japan Corporation) and cured to fabricate a magnetic body sheet with a flexibility formed by laminating a magnetic body formed body composed of a sheet body with a film thickness of 30 µm [PET substrate (100 µm)+magnetic body formed body (30 µm)]. FIGURE illustrates a schematic and structural diagram of a magnetic body sheet. In the FIGURE, reference numeral 1, reference numeral 2, and reference numeral 3 indicate a magnetic body sheet, a magnetic body formed body, and a PET film, respectively. This was applied to a characteristic evaluation as described below.

Practical Example 2

28.4% by mass of multifunctional epoxy resin EPPN-502 (commercial name, produced by NIPPON KAYAKU Co., Ltd.), 3.0% by mass of brominated epoxy resin AER-8028 (commercial name, produced by Asahi Kasei Corporation), 8.2% by mass of multifunctional phenol resin HER-7500 (commercial name, produced by MEIWA PLASTIC INDUSTRIES, LTD.), 0.4% by mass of 2-methylimidazole as an accelerating agent, 1.0% by mass of an ester-type wax (carnauba No. 1), 1.0% by mass of an epoxy silane coupling agent, 19.0% by mass of a solvent (ethylcellosolve), 38.6% by mass of spherical nanoparticles (number average particle diameter: 65 nm) as a magnetic body that included a Zn oxide and an FeCo oxide as essential components, 0.2% by mass of a resin-coated fullerene (resin quantity: 10% by mass, particle diameter: about 1 μm, value of powder resistance: $1.0 \times 10^2$ Ω·nm), and 0.2% by mass of reactive silicone oil KF8008 (commercial name, produced by Shin-Etsu Chemical Co., Ltd., and amine equivalent: 5700) were mixed at an ordinary temperature, subsequently heated and kneaded at a resin temperature of 80° C., and cooled to obtain a magnetic body composition.

Additionally, a composition ratio of the Zn oxide in the magnetic body is 1.0% by mass in 38.6% by mass of the magnetic body.

Furthermore, the resin-coated fullerene was such that fullerene was coated with an epoxy resin epikote 630 (commercial name, produced by Japan Epoxy Resin CO., Ltd.).

The obtained magnetic body composition was dissolved or dispersed in a solvent (ethylcellosolve) to prepare a coating fluid. The prepared coating fluid was applied onto a PET film with a thickness of 100 μm (Lumirror: registered trademark, produced by TORAY INDUSTRIES INC.) by screen printing (printing machine: a manual screen printing machine produced by Neotechno Japan Corporation), dried and cured to fabricate a magnetic body sheet with a flexibility formed by laminating a magnetic body formed body composed of a sheet body with a film thickness of 30 μm [PET substrate (100 μm)+magnetic body formed body (30 μm)]. FIGURE illustrates a schematic and structural diagram of a magnetic body sheet. This was applied to a characteristic evaluation as described below.

Practical Example 3

28.4% by mass of multifunctional epoxy resin EPPN-502 (commercial name, produced by NIPPON KAYAKU Co., Ltd.), 3.0% by mass of brominated epoxy resin AER-8028 (commercial name, produced by Asahi Kasei Corporation), 8.2% by mass of multifunctional phenol resin MEH-7500 (commercial name, produced by MEIWA PLASTIC INDUSTRIES, LTD.), 0.4% by mass of 2-methylimidazole as an accelerating agent, 1.0% by mass of an ester-type wax (carnauba No. 1), 1.0% by mass of an epoxy silane coupling agent, 19.0% by mass of a solvent (ethylcellosolve), 38.6% by mass of spherical nanoparticles (number average particle diameter: 65 nm) as a magnetic body that included an Sn oxide and an FeCo oxide as essential components, 0.2% by mass of a resin-coated fullerene (resin quantity: 10% by mass, particle diameter: about 1 μm, value of powder resistance: $1.0 \times 10^2$ Ω·nm), and 0.2% by mass of reactive silicone oil KF8008 (commercial name, produced by Shin-Etsu Chemical Co., Ltd., and amine equivalent: 5700) were mixed at an ordinary temperature, subsequently heated and kneaded at a resin temperature of 80° C., and cooled to obtain a magnetic body composition.

Additionally, a composition ratio of the Sn oxide in the magnetic body is 1.0% by mass in 38.6% by mass of the magnetic body.

Furthermore, the resin-coated fullerene was such that fullerene was coated with an epoxy resin epikote 630 (commercial name, produced by Japan Epoxy Resin CO., Ltd.).

The obtained magnetic body composition was dissolved or dispersed in a solvent (ethylcellosolve) to prepare a coating fluid. The prepared coating fluid was applied onto a PET film with a thickness of 100 μm (Lumirror: registered trademark, produced by TORAY INDUSTRIES INC.) by screen printing (printing machine: a manual screen printing machine produced by Neotechno Japan Corporation), dried and cured to fabricate a magnetic body sheet with a flexibility formed by laminating a magnetic body formed body composed of a sheet body with a film thickness of 30 μm [PET substrate (100 μm)+magnetic body formed body (30 μm)]. FIGURE illustrates a schematic and structural diagram of a magnetic body sheet. This was applied to a characteristic evaluation as described below.

Practical Example 4

28.4% by mass of multifunctional epoxy resin EPPN-502 (commercial name, produced by NIPPON KAYAKU Co., Ltd.), 3.0% by mass of brominated epoxy resin AER-8028 (commercial name, produced by Asahi Kasei Corporation), 8.2% by mass of multifunctional phenol resin MEH-7500 (commercial name, produced by MEIWA PLASTIC INDUSTRIES, LTD.), 0.4% by mass of 2-methylimidazole as an accelerating agent, 1.0% by mass of an ester-type wax (carnauba No. 1), 1.0% by mass of an epoxy silane coupling agent, 19.0% by mass of a solvent (ethylcellosolve), 38.6% by mass of spherical nanoparticles (number average particle diameter: 65 nm) as a magnetic body that included a Ga oxide and an FeCo oxide as essential components, 0.2% by mass of a resin-coated fullerene (resin quantity: 10% by mass, particle diameter: about 1 μm, value of powder resistance: $1.0 \times 10^2$ Ω·nm), and 0.2% by mass of reactive silicone oil KF8008 (commercial name, produced by Shin-Etsu Chemical Co., Ltd., and amine equivalent: 5700) were mixed at an ordinary temperature, subsequently heated and kneaded at a resin temperature of 80° C., and cooled to obtain a magnetic body composition.

Additionally, a composition ratio of the Ga oxide in the magnetic body is 1.0% by mass in 38.6% by mass of the magnetic body.

Furthermore, the resin-coated fullerene was such that fullerene was coated with an epoxy resin epikote 630 (commercial name, produced by Japan Epoxy Resin CO., Ltd.).

The obtained magnetic body composition was dissolved or dispersed in a solvent (ethylcellosolve) to prepare a coating fluid. The prepared coating fluid was applied onto a PET film with a thickness of 100 μm (Lumirror: registered trademark, produced by TORAY INDUSTRIES INC.) by screen printing (printing machine: a manual screen printing machine produced by Neotechno Japan Corporation), dried and cured to fabricate a magnetic body sheet with a flexibility formed by laminating a magnetic body formed body composed of a sheet body with a film thickness of 30 μm [PET substrate (100 μm)+magnetic body formed body (30 μm)]. FIGURE illustrates a schematic and structural diagram of a magnetic body sheet. This was applied to a characteristic evaluation as described below.

Comparative Example 1

24.0% by mass of multifunctional epoxy resin EPPN-502 (commercial name, produced by NIPPON KAYAKU Co., Ltd.), 7.2% by mass of brominated epoxy resin AER-8028 (commercial name, produced by Asahi Kasei Corporation), 8.8% by mass of multifunctional phenol resin MEH-7500 (commercial name, produced by MEIWA PLASTIC INDUS- TRIES, LTD.), 0.5% by mass of 2-methylimidazole as an accelerating agent, 0.2% by mass of an ester-type wax (carnauba No. 1), 0.3% by mass of an epoxy silane coupling agent, 40.0% by mass of needle $Fe_2O_3$ particles (longer axis: 135 nm and a shorter axis: 22 nm) as a magnetic body, 0.2% by mass of a resin-coated carbon black (resin quantity: 10% by mass, particle diameter: about 1 μm, value of powder resistance: $1.0 \times 10^2$ Ω·nm), and 18.8% by mass of a solvent (ethylcellosolve) were mixed at an ordinary temperature, subsequently heated and kneaded at a resin temperature of 80° C., and cooled to obtain a magnetic body composition.

Furthermore, the resin-coated carbon black was such that a carbon black (ash content: less than or equal to 1.0% by mass, a specific surface area: 170 $m^2/g$) was coated with an epoxy resin epikote 630 (commercial name, produced by Japan Epoxy Resin CO., Ltd.).

The obtained magnetic body composition was dissolved or dispersed in a solvent (ethylcellosolve) to prepare a coating fluid. The prepared coating fluid was applied onto a PET film with a thickness of 100 μm (Lumirror: registered trademark, produced by TORAY INDUSTRIES INC.) by screen printing (printing machine: a manual screen printing machine produced by Neotechno Japan Corporation) and cured to fabricate a magnetic body sheet with a flexibility formed by laminating a magnetic body formed body composed of a sheet body with a film thickness of 30 μm [PET substrate (100 μm)+magnetic body formed body (30 μm)]. A schematic and structural diagram of a magnetic body sheet is similar to FIGURE. This was applied to a characteristic evaluation as described below.

Magnetic permeabilities of magnetic body sheets fabricated in Practical Examples 1-4 and Comparative Example 1 as described above were measured and evaluated by a magnetic permeability measuring device. The results of measurement will be illustrated in Table as described below.

TABLE

| Examples | Magnetic permeability at 1 GHz (H/m) |
| --- | --- |
| Practical Example 1 | 8.9 |
| Practical Example 2 | 9.5 |
| Practical Example 3 | 10.2 |
| Practical Example 4 | 9.3 |
| Comparative Example 1 | 0.1 |

As is clear from Table, it is found that any of the magnetic body sheets that were fabricated by using a magnetic body composition according to an embodiment of the present invention had a higher magnetic permeability greater than or equal to 8 and an excellent characteristic. On the other hand, Comparative Example 1 using the needle $Fe_2O_3$ particles as a magnetic body indicated a smaller magnetic permeability that was 0.1 and a deteriorated magnetic permeation.

That is, a magnetic body formed body formed by using a magnetic body composition that includes a nanoparticle(s) as a magnetic body that includes an oxide of at least one kind of metal selected from Ga, Zn, and Sn elements and an FeCo oxide as essential components in an embodiment of the present invention may be able to exert a better magnetic permeability at a higher frequency domain (for example, 1 GHz). Thereby, for example, it may be useful for defense against electromagnetic wave noise of each kind of electronic instrument or device such as a digital camera or a mobile phone, or an UHF instrument such as a microprocessor, LSI, or liquid crystal panel of a notebook personal computer or RF device, or the like, and widely applicable.

APPENDIX

<An Illustrative Embodiment(s) of a Magnetic Body Composition and a Magnetic Body Formed Body Using It>

At least one illustrative embodiment of the present invention may relate to at least one of a magnetic body material that has an electromagnetic wave absorbing power and is applicable to defense against electromagnetic wave noise, etc., in particular, relate to a magnetic body composition that contains a nanometer size magnetic material (a nanoparticle(s)) and a magnetic body formed body formed and provided by using the magnetic body composition.

An object of at least one illustrative embodiment of the present invention may be to provide a magnetic body composition that contains a nanometer size magnetic material (a nanoparticle(s)) excellent in an electromagnetic wave absorbing power and a magnetic body formed body formed and provided by using the magnetic body composition.

Furthermore, at least one illustrative embodiment of the present invention may have been achieved by finding that a problem(s) as described above may be solved by using a nanoparticle(s) that include(s) an oxide of at least one kind of metal selected from Ga, Zn, and Sn elements and a FeCo oxide as essential components.

That is, at least one illustrative embodiment of the present invention may solve a problem(s) as described above by a magnetic body composition that contains a resin and a magnetic body composed of a nanoparticle(s), wherein the magnetic body composition is characterized in that the magnetic body is a nanoparticle(s) that include(s) an oxide of at least one kind of metal selected from Ga, Zn, and Sn elements and an FeCO oxide as essential components.

Furthermore, at least one illustrative embodiment of the present invention may solve a problem(s) as described above by a magnetic body formed body characterized by being formed and provided by using a magnetic body composition as described below.

Illustrative Embodiment (1) is a magnetic body composition that contains a resin and a magnetic body composed of a nanoparticle(s), wherein the magnetic body composition is characterized in that the magnetic body is a nanoparticle(s) that include(s) an oxide of at least one kind of metal selected from Ga, Zn, and Sn elements and an FeCo oxide.

Illustrative Embodiment (2) is the magnetic body composition as described in Illustrative Embodiment (1), characterized in that the magnetic body is a spherical particle(s) with a number average particle diameter greater than or equal to 30 nm and less than or equal to 90 nm.

Illustrative Embodiment (3) is the magnetic body composition as described in Illustrative Embodiment (1) or (2), characterized in that a content of the magnetic body is greater than or equal to 20% by mass and less than or equal to 50% by mass in an entire composition.

Illustrative Embodiment (4) is the magnetic body composition as described in any of Illustrative Embodiments (1) to (3), characterized in that the resin includes an epoxy resin and a phenol resin curing agent.

Illustrative Embodiment (5) is the magnetic body composition as described in Illustrative Embodiment (4), characterized in that a silicone oil that has an amino group is contained in the resin that includes the epoxy resin and the phenol resin curing agent.

Illustrative Embodiment (6) is the magnetic body composition as described in any of Illustrative Embodiments (1) to (5), characterized in that at least one kind of material selected from a carbon nanotube, a fullerene, and a carbon is contained in the composition.

Illustrative Embodiment (7) is a magnetic body formed body characterized by being formed and provided by using the magnetic body composition as described in any of Illustrative Embodiments (1) to (6).

Illustrative Embodiment (8) is the magnetic body formed body described in Illustrative Embodiment (7), characterized in that the magnetic body formed body is a sheet body or bulk body for defense against electromagnetic wave noise.

Illustrative Embodiment (9) is the magnetic body formed body as described in Illustrative Embodiment (7) or (8), characterized in that a magnetic permeability of the magnetic body formed body is greater than or equal to 2 H/m at 1 GHz.

According to at least one illustrative embodiment of the present invention, it may be possible to provide a magnetic body composition provided by containing a resin and a magnetic body composed of a nanoparticle(s) that include(s) an oxide of at least one kind of metal selected from Ga, Zn, and Sn elements and an FeCo oxide as essential components, so that it may be possible to provide a magnetic body formed body used in a higher frequency domain (in particular, greater than or equal to 1 GHz).

Furthermore, a magnetic body formed body (a sheet body, a bulk body, or the like) formed and provided by using a magnetic body composition according to at least one illustrative embodiment of the present invention contains a nanometer size magnetic material (for example, a spherical nanoparticle(s) with a number average particle diameter greater than or equal to 30 nm and less than or equal to 90 nm) excellent in an electromagnetic wave absorbing power, so that it may be possible to be widely applied for defense of each kind of electronic instrument or device (for example, a digital camera or a mobile phone, a microprocessor or LSI for a notebook personal computer, a UHF instrument or RF instrument such as a liquid crystal panel, or the like) against electromagnetic wave noise.

Although the illustrative embodiment(s) and specific example(s) of the present invention have been described with reference to the accompanying drawing(s), the present invention is not limited to any of the illustrative embodiment(s) and specific example(s), and the illustrative embodiment(s) and specific example(s) may be altered, modified, or combined without departing from the scope of the present invention.

The present application claims the benefit of priority based on Japanese Patent Application No. 2012-115660 filed on May 21, 2012, the entire content of which is hereby incorporated by reference herein.

What is claimed is:

1. A magnetic body composition, comprising:
    a resin; and
    a magnetic nanoparticle, the magnetic nanoparticle including an oxide of at least one kind of metal selected from the group consisting of Ga, Zn, and Sn and an FeCo oxide,
    wherein the resin includes an epoxy resin and a phenol resin curing agent.

2. The magnetic body composition as claimed in claim 1 wherein the magnetic nanoparticle is a spherical particle with a number average particle diameter of 30 nm or greater and 90 nm or less.

3. The magnetic body composition as claimed in claim 1, wherein a content of the magnetic nanoparticle is 20% by mass or greater and 50% by mass or less.

4. The magnetic body composition as claimed in claim 1, wherein the resin further includes a silicone oil with an amino group.

5. The magnetic body composition as claimed in claim 1, further comprising at least one kind of material selected from the group consisting of a carbon nanotube, a fullerene, and a carbon.

6. A magnetic body product produced by using the magnetic body composition as claimed in claim 1.

7. The magnetic body product claimed in claim 6, wherein the magnetic body product is a sheet body or a hulk body.

8. The magnetic body product as claimed in claim 6, wherein a magnetic permeability of the magnetic body product is 2 μm or greater at 1 GHz.

* * * * *